US006670255B2

(12) United States Patent
Adkisson et al.

(10) Patent No.: US 6,670,255 B2
(45) Date of Patent: Dec. 30, 2003

(54) METHOD OF FABRICATING LATERAL DIODES AND BIPOLAR TRANSISTORS

(75) Inventors: James W. Adkisson, Jericho, VT (US); Jeffrey P. Gambino, Westford, VT (US); Peter B. Gray, Essex, VT (US); Anthony K. Stamper, Williston, VT (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/965,289

(22) Filed: Sep. 27, 2001

(65) Prior Publication Data

US 2003/0059985 A1 Mar. 27, 2003

(51) Int. Cl.⁷ ............................................. H01L 21/331
(52) U.S. Cl. ..................... 438/343; 257/587; 257/586
(58) Field of Search ................. 438/149, 141; 257/144, 146, 151, 152, 577, 586, 587, 565, 566, 584, 888, 590

(56) References Cited

U.S. PATENT DOCUMENTS

| 3,718,502 | A | * | 2/1973 | Gibbons ..................... 117/212 |
| 4,737,836 | A | | 4/1988 | Askin et al. |
| 4,800,171 | A | | 1/1989 | Iranmanesh et al. |
| 4,893,158 | A | | 1/1990 | Mihara et al. |
| 4,949,153 | A | | 8/1990 | Hirao et al. |
| 5,032,891 | A | | 7/1991 | Takagi et al. |
| 5,072,287 | A | * | 12/1991 | Nakagawa et al. ........... 357/50 |
| 5,073,506 | A | * | 12/1991 | Maszara et al. ............... 437/21 |
| 5,227,316 | A | | 7/1993 | Vora et al. |
| 5,399,899 | A | * | 3/1995 | Dekker et al. ............... 257/566 |
| 5,457,062 | A | | 10/1995 | Keller et al. |
| 5,477,065 | A | * | 12/1995 | Nakagawa et al. ......... 257/146 |
| 5,629,544 | A | | 5/1997 | Voldman et al. |
| 5,646,055 | A | * | 7/1997 | Tsoi ............................. 437/31 |
| 5,670,820 | A | | 9/1997 | Campbell et al. |
| 5,689,133 | A | * | 11/1997 | Li et al. ...................... 257/361 |
| 5,930,638 | A | | 7/1999 | Reedy et al. |
| 5,959,343 | A | | 9/1999 | Harada et al. |
| 5,976,991 | A | * | 11/1999 | Laxman et al. ............. 438/786 |
| 6,246,104 | B1 | * | 6/2001 | Tsuda et al. ................. 257/558 |
| 6,337,494 | B1 | * | 1/2002 | Ryum et al. ................. 257/197 |

FOREIGN PATENT DOCUMENTS

JP          406151825 A  *  5/1994

* cited by examiner

*Primary Examiner*—Wael Fahmy
*Assistant Examiner*—Dana Farahani
(74) *Attorney, Agent, or Firm*—Schmeiser, Olsen & Watts; William D. Sabo

(57) ABSTRACT

Disclosed is a method of fabricating a lateral semiconductor device, comprising:

providing a substrate, having at least an upper silicon portion forming at least one first dopant type region and at least one second dopant type region in the upper portion of the substrate, at least one of the first dopant type regions abutting at least one of the second dopant type regions and thereby forming at least one PN junction; and forming at least one protective island on a top surface of the upper silicon portion, the protective island extending the length of the PN junction and overlapping a portion of the first dopant type region and a portion of an abutting second dopant type region.

44 Claims, 7 Drawing Sheets

METHOD OF FABRICATING LATERAL DIODES AND BIPOLAR TRANSISTORS

FIELD OF THE INVENTION

The present invention relates to the field of semiconductor devices; more specifically, it relates to lateral diodes and lateral bipolar transistors and the method of fabricating said diodes and transistors.

BACKGROUND OF THE INVENTION

In both silicon-on-insulator (SOI), bipolar/complementary metal-oxide-silicon (BICMOS) and SiGe BICMOS technologies there is a need for diodes and non-SiGe bipolar transistors.

One type of diode available to SOI/CMOS technology is a gated diode. Gated diodes use a dummy gate over the PN junction. The dielectric spacers formed on the sidewalls of the dummy gate prevent the silicide contact process from shorting out the junction. However, gated diodes, especially as the gate oxide becomes thin, can suffer from the problem of the leakage current through the dummy gate being greater than the leakage current through the diode, resulting in excessive power consumption.

In BICMOS technology there is a need for transistors capable of running at voltages higher than the gate dielectric breakdown voltages of the CMOS transistors. One such need is found in pre-amplifier circuits. One type of bipolar transistor available for BICMOS and SiGe BICMOS technology is a lateral bipolar transistor wherein the base width of the transistor is defined by the CMOS gate process, which also prevents the silicide contact process from shorting out the emitter, base and collector. The emitter and collector are defined by the CMOS source/drain (S/D) dopant processes. However, the resultant bipolar transistor exhibits both FET and bipolar characteristics and is difficult to model.

A diode and lateral bipolar transistor, fabricated without the use of CMOS gate technology to prevent the junctions of the diode and the emitter, base and collector of the transistor from shorting would result in devices with lower leakages and purer diode and bipolar transistor characteristics and allow voltages to be applied to the diode and lateral bipolar transistor greater than the CMOS device gate dielectric breakdown voltage.

SUMMARY OF THE INVENTION

A first aspect of the present invention is a method of fabricating a lateral semiconductor device, comprising: providing a substrate, having at least an upper silicon portion, forming at least one first dopant type region and at least one second dopant type region in the upper portion of the substrate, at least one of the first dopant type regions abutting at least one of the second dopant type regions and thereby forming at least one PN junction; and forming at least one protective island on a top surface of the upper silicon portion, the protective island extending the length of the PN junction and overlapping a portion of the first dopant type region and a portion of an abutting second dopant type region A second aspect of the present invention is a method of fabricating a lateral diode, comprising: providing a silicon substrate; forming an N-region and a P-region in the substrate, the P-region abutting the N-region and thereby forming a PN junction; and forming a protective island on a top surface of the substrate, the protective island extending the length of the PN junction and overlapping a portion of the N-region and a portion of the P-region.

A third aspect of the present invention is a method of fabricating a lateral bipolar transistor, comprising: providing a silicon substrate; forming an emitter region, a base region and a collector region in the silicon substrate, the emitter region abutting the base region and thereby forming a first PN junction and the collector region abutting the base region and thereby forming a second PN junction; forming a protective island on the top surface of the silicon substrate, the protective island extending the length of the first PN junction and overlapping a portion of the emitter region and a portion of the base region; and the protective island extending the length of the second PN junction and overlapping a portion of the collector region and a portion of the base region.

A fourth aspect of the present invention is a method of fabricating a lateral diode, comprising: providing a silicon on insulator substrate comprising a silicon layer over an insulator; forming an N-region and a P-region in the silicon layer, the P-region abutting the N-region and thereby forming a PN junction; and forming a protective island on a top surface of the silicon layer of the substrate, the protective island extending the length of the PN junction and overlapping a portion of the N-region and a portion of the P-region.

A fifth aspect of the present invention is a method of fabricating a lateral bipolar transistor, comprising: providing a silicon on insulator substrate comprising a silicon layer over an insulator; forming an emitter region, a base region and a collector region in the silicon layer, the emitter region abutting the base region and thereby forming a first PN junction and the collector region abutting the base region and thereby forming a second PN junction; forming a protective island on the top surface of the silicon layer of the substrate, the protective island extending the length of the second PN junction and overlapping a portion of the emitter region and a portion of the base region; and the protective island extending the length of the third PN junction and overlapping a portion of the collector region and a portion of the base region.

A sixth aspect of the present invention is a lateral semiconductor device, comprising: a substrate, having at least an upper silicon portion; at least one first dopant type region and at least one second dopant type region in the upper portion of the substrate, at least one of the first dopant type regions abutting at least one of the second dopant type regions and thereby forming at least one PN junction; and at least one protective island on a top surface of the upper silicon portion, the protective island extending the length of the PN junction and overlapping a portion of the first dopant type region and a portion of an abutting second dopant type region.

A seventh aspect of the present invention is a lateral diode, comprising: a silicon substrate; an N-region and a P-region in the substrate, the P-region abutting the N-region and thereby forming a PN junction; and a protective island on a top surface of the silicon substrate, the protective island extending the length of the PN junction and overlapping a portion of the N-region and a portion of the P-region.

An eighth aspect of the present invention is a lateral bipolar transistor, comprising: a silicon substrate; an emitter region, a base region and a collector region in the silicon substrate, the emitter region abutting the base region and thereby forming a first PN junction and the collector region abutting the base region and thereby forming a second PN junction; a protective island on the top surface of the silicon substrate, the protective island extending the length of the first PN junction and overlapping a portion of the emitter region and a portion of the base region; and the protective island extending the length of the second PN junction and overlapping a portion of the collector region and a portion of the base region.

A ninth aspect of the present invention is a lateral diode, comprising: a silicon on insulator substrate comprising a silicon layer over an insulator; an N-region and a P-region in the silicon layer, the P-region abutting the N-region and thereby forming a PN junction; and a protective island on a top surface of the silicon layer of the substrate, the protective island extending the length of the PN junction and overlapping a portion of the N-region and a portion of the P-region.

A tenth aspect of the present invention is a lateral bipolar transistor, comprising: a silicon on insulator substrate comprising a silicon layer over an insulator; an emitter region, a base region and a collector region in the silicon layer, the emitter region abutting the base region and thereby forming a first PN junction and the collector region abutting the base region and thereby forming a second PN junction; a protective island on the top surface of the silicon layer of the substrate, the protective island extending the length of the second PN junction and overlapping a portion of the emitter region and a portion of the base region; and the protective island extending the length of the third PN junction and overlapping a portion of the collector region and a portion of the base region.

BRIEF DESCRIPTION OF DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

The first embodiment of the invention will be described and illustrated showing a lateral diode, a lateral bipolar PNP transistor and a SiGe bipolar transistor fabricated together. It should be understood, however, that the lateral diode, the lateral bipolar PNP transistor and the SiGe bipolar transistor may be fabricated separately or in any combination.

Figure 1:
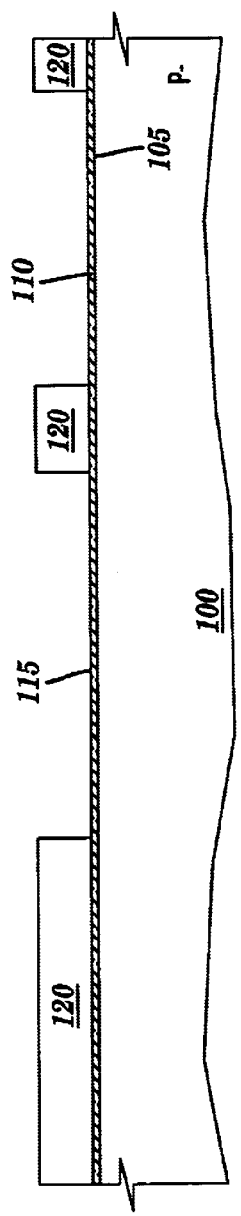
FIGS. 1 through 10 are cross-sectional side views illustrating fabrication of a lateral diode and a lateral bipolar transistor according to a first embodiment of the present invention.

FIGS. 1 through 10 are cross-sectional side views illustrating fabrication of a lateral diode and a lateral bipolar transistor according to a first embodiment of the present invention. In FIG. 1, a P-type bulk silicon substrate 100 is provided. Formed on a top surface 105 of silicon substrate 100 is a protective layer 110. Formed on a top surface 115 of protective layer 110 is a patterned ion implantation (I/I) mask 120. In one example, protective layer is thermal or chemical vapor deposition (CVD) silicon oxide and is about 50 to 250 Å thick and patterned I/I mask 120 is photoresist.

Figure 2:
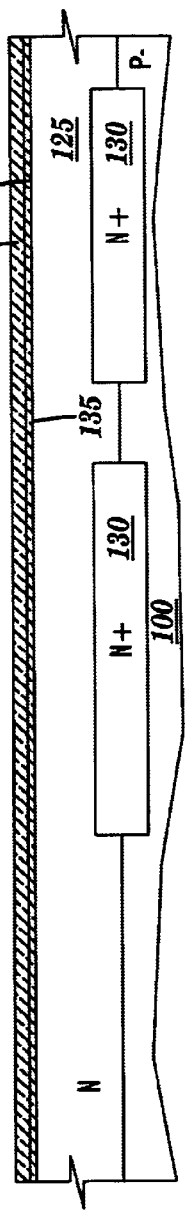

In FIG. 2, an N-type I/I is performed. I/I implant mask 120 and protective layer 110 are removed. Top surface 105 of silicon substrate 100 is cleaned. An epitaxial layer 125 grown to form buried N+ regions 130. A protective lower layer 140 is formed on a top surface 135 of epitaxial layer 125 and a protective upper layer 145 is formed on top of the lower protective layer. In one example, the N-type I/I is about $1E^{15}$ to $2E^{16}$ atm/cm$^2$ of arsenic implanted at about 20 to 500 Kev, lower layer 140 is silicon oxide about 60 to 80 Å thick and upper layer 145 is silicon nitride about 1000 to 1700 Å thick. Epitaxial layer 125 is about 0.60 to 2.0 microns thick. Epitaxial layer 125 is grown intrinsic but is doped N type by auto-doping and out diffusion from buried N+ regions 130. In one example, the cleaning of top surface 105 of silicon substrate 100 comprises acid and basic cleans followed by a dry/wet/dry oxidation followed by removal of the oxide layer formed prior to epitaxial growth.

Figure 3:
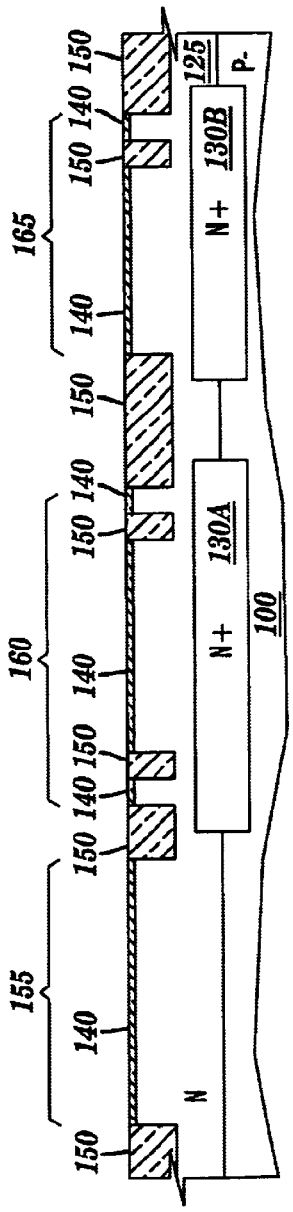

In FIG. 3, trench isolation 150 is formed in epitaxial layer 125, the trench isolation recessed and upper layer 145 removed leaving islands of lower layer 140. Trench isolation 150 is formed by etching a pattern in upper and lower layers 140 and 145, etching a trench in epitaxial layer 125, depositing an insulator (e.g. silicon oxide) to fill the trench and then performing a chemical-mechanical-polish (CMP) to remove excess insulator from on top of upper layer 145 and planarize the resulting surface. Trench isolation 150 defines a lateral diode region 155, a lateral bipolar transistor region 160 and a SiGe bipolar transistor region 165. In lateral bipolar transistor region 160, buried N+ region 130 becomes buried isolation 130A and in SiGe bipolar transistor region 165, buried N+ region 130 becomes subcollector 130B.

Figure 4:
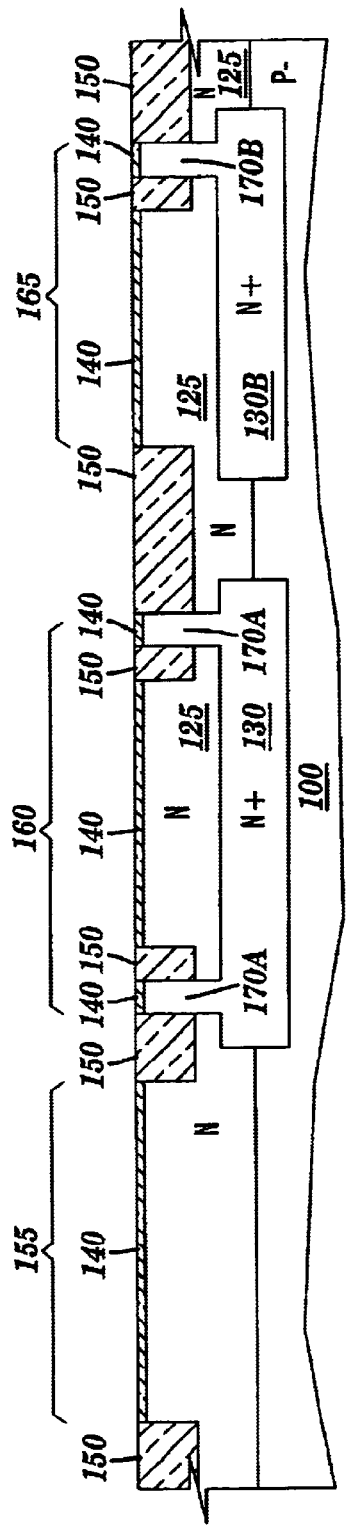

In FIG. 4, a reach through I/I is performed to form diffused isolation/base contacts 170A to intrinsic base 125A and buried isolation 130A in lateral bipolar transistor region 160 and to form a diffused collector contact 170B to buried subcollector 130B in SiGe bipolar transistor region 165. In one example, reach through I/I is about $2E^{15}$ to $4E^{15}$ atm/cm$^2$ of phosphorus implanted at about 70 to 150 Kev.

Figure 5:
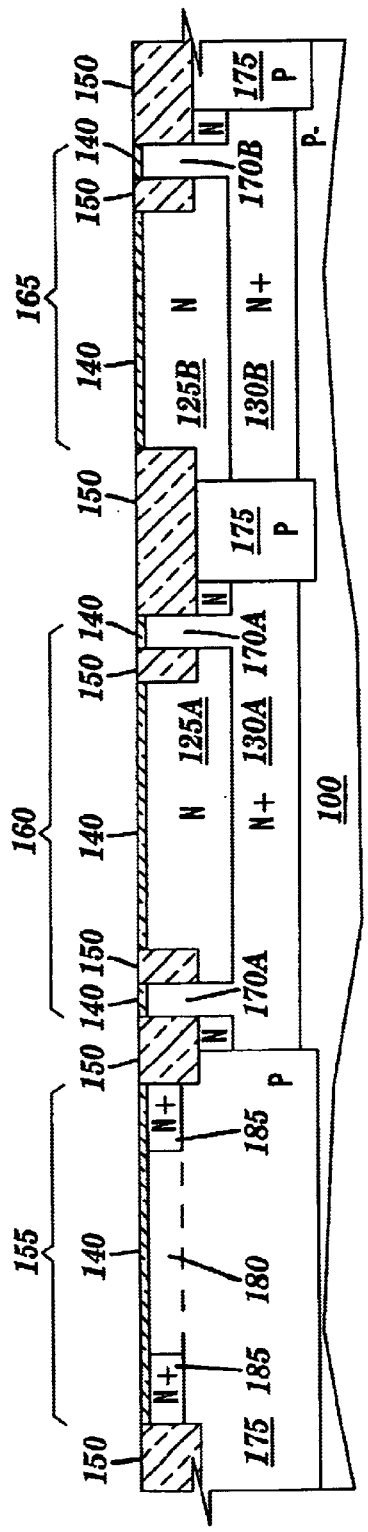

In FIG. 5, a P-type isolation I/I is performed to create isolation regions 175 in epitaxial layer 125, the isolation regions extending into silicon substrate 100, and a P-region 180 in lateral diode region 155, near top surface 135 of epitaxial layer 125. Formation of isolation regions 175 also defines an intrinsic base region 125A in lateral bipolar transistor region 160 and a collector region 125B in SiGe bipolar transistor region 165. In one example, the isolation implant is a three step I/I. The first I/I is about $1E^{12}$ to $1E^{14}$ atm/cm$^2$ of boron implanted at about 25 to 75 Kev. The second I/I is about $1E^{12}$ to $1E^{14}$ atm/cm$^2$ of boron implanted at about 100 to 300 Kev. The third I/I is about $1E^{12}$ to $1E^{14}$ atm/cm$^2$ of boron implanted at about 200 to 600 Kev. The first I/I implant controls the diode characteristics of the diode that will be formed in lateral diode region 155. Then, an N-type I/I implant is performed to form an N+-region 185 in lateral diode region 155. In a first example, the N-type I/I is about $1.5E^{15}$ to $4E^{15}$ atm/cm$^2$ of phosphorus implanted at about 5 to 25 Kev. In a second example, the N-type I/I is about $1E^{14}$ to $1E^{16}$ atm/cm$^2$ of arsenic implanted at about 0.5 to 50 Kev.

Figure 6:
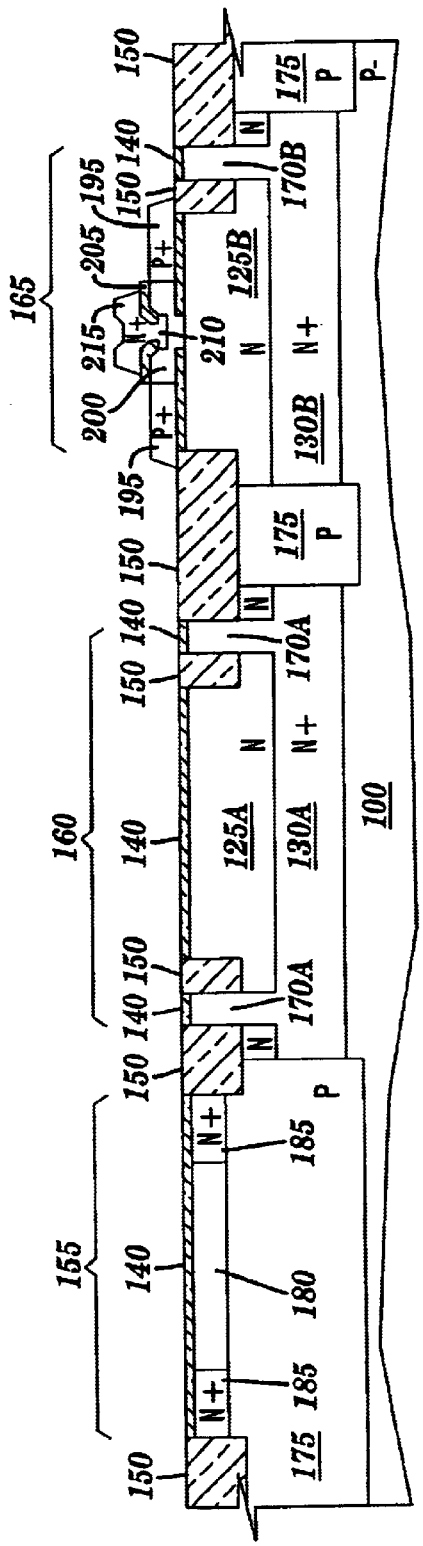

In FIG. 6, an emitter and base for an NPN SiGe bipolar transistor is formed in SiGe bipolar transistor region 165 by processes known to one skilled in the art. Briefly those processes include: forming an opening in lower layer 140, forming an intrinsic SiGe layer over the opening in lower layer 140, performing a P-type I/I to define an extrinsic base region 195, an intrinsic base region 200, forming a patterned dielectric layer 205 over the intrinsic base region, and depositing polysilicon silicon followed by an N-type ion implant to form a poly-crystalline emitter 210 and an emitter contact 215. The N-type polysilicon auto-dopes emitter 210 N-type.

Figure 7:
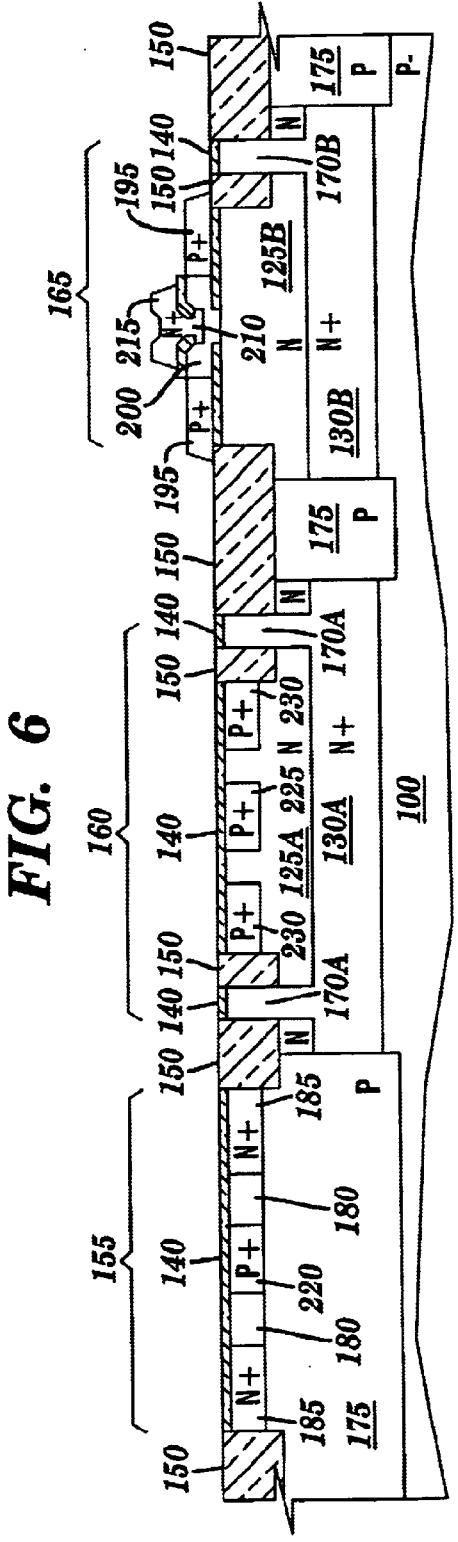

In FIG. 7, a P-type I/I is performed to form a P+ contact region 220 to P-region 180 in lateral diode region 155 and an emitter 225 and a collector 230 in lateral bipolar transistor region 160. In one example, the P-type I/I is about $11E^{14}$ to $4E^{15}$ atm/cm$^2$ of boron implanted at about 7 to 15 Kev.

Figure 8:
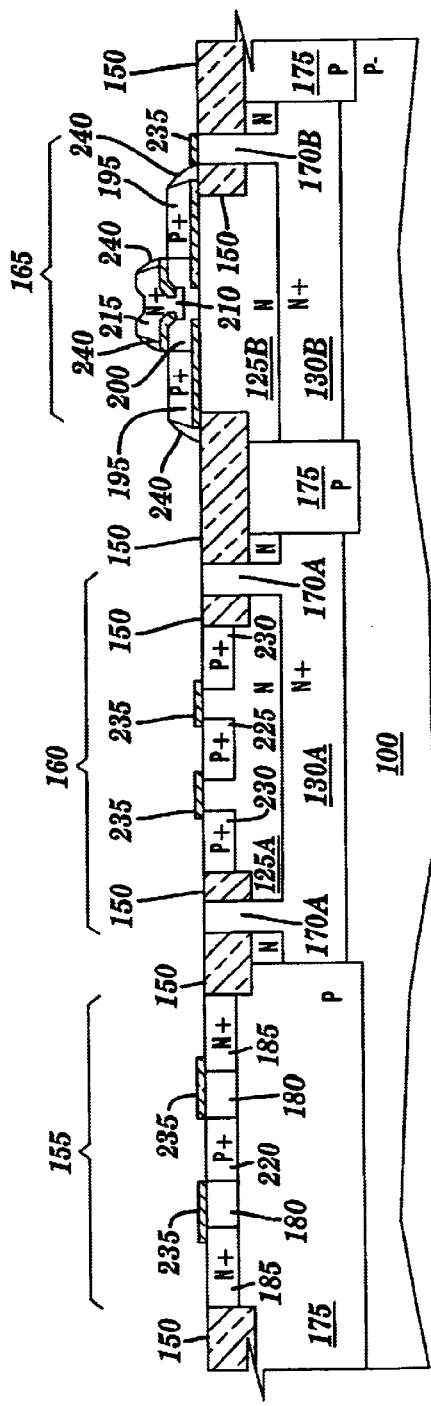

In FIG. 8, lower layer 140 is removed. A rapid thermal anneal (RTA) is performed under 6% $O_2$ in $N_2$ to grow about 10 to 20 Å of thin oxide on exposed silicon surfaces. In one example, about 150 to 500 Å of silicon nitride is deposited by CVD and patterned to form protective islands 235. Protective islands 235 may also be formed from silicon nitride or silicon nitride over silicon oxide, silicon carbide or any insulator capable of withstanding 700° C. Protective islands 235 extend the entire length of the P-region 180/ N+-region 185 PN junction and partially overlap the P-region and the N+-region. Protective islands 235 extend the entire length of the emitter 225/intrinsic base 125A PN junction and partially overlap the emitter and the base. Protective islands 235 extend the entire length of the collector 230/intrinsic base 125A PN junction and partially overlap the collector and the base. Spacers 240, in SiGe bipolar transistor region 165 may be formed at the same time protective islands 235 are formed or may be formed in a separate process step.

Figure 9:
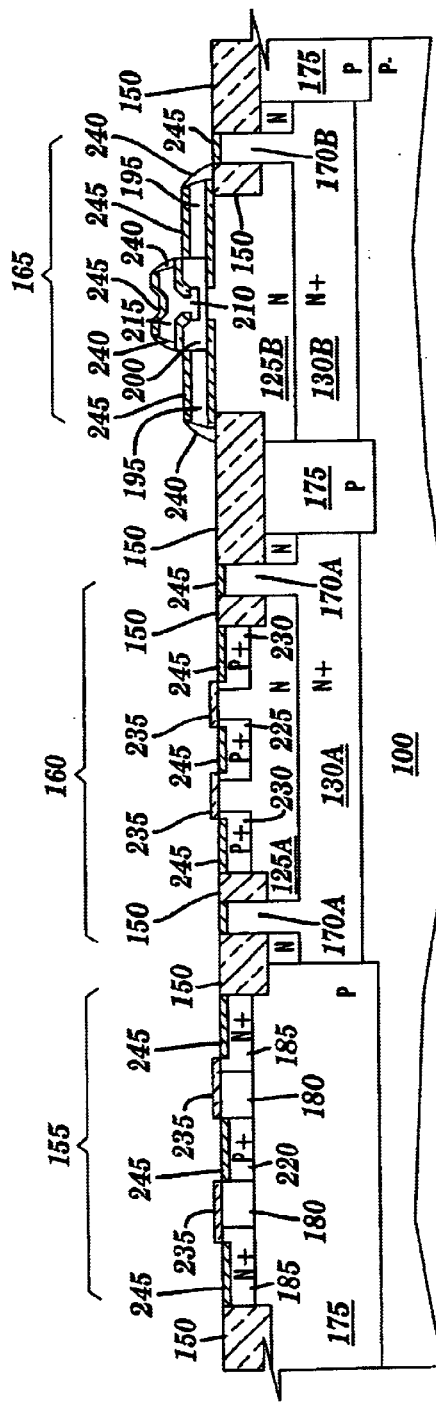

In FIG. 9, the thin oxide layer formed by RTA described above is removed and silicide contacts 245 are formed. Silicide contacts 245 are formed in N+-region 185 P+ and P+ contact region 220 in lateral diode region 155. Silicide contacts 245 are formed in emitter 225, collector 230 and diffused isolation/base contacts 170A in lateral bipolar transistor region 160. Silicide contacts 245 are formed in diffused collector contact 170B, extrinsic base region 195 and emitter contact 215 in SiGe bipolar transistor region 165. Silicide contacts 245 may be formed by depositing about 400 to 500 Å of titanium or cobalt and annealing at 700° C. under $N_2$ to form titanium silicide or cobalt silicide respectively. Unreacted titanium or cobalt is removed by wet etching.

Figure 10:
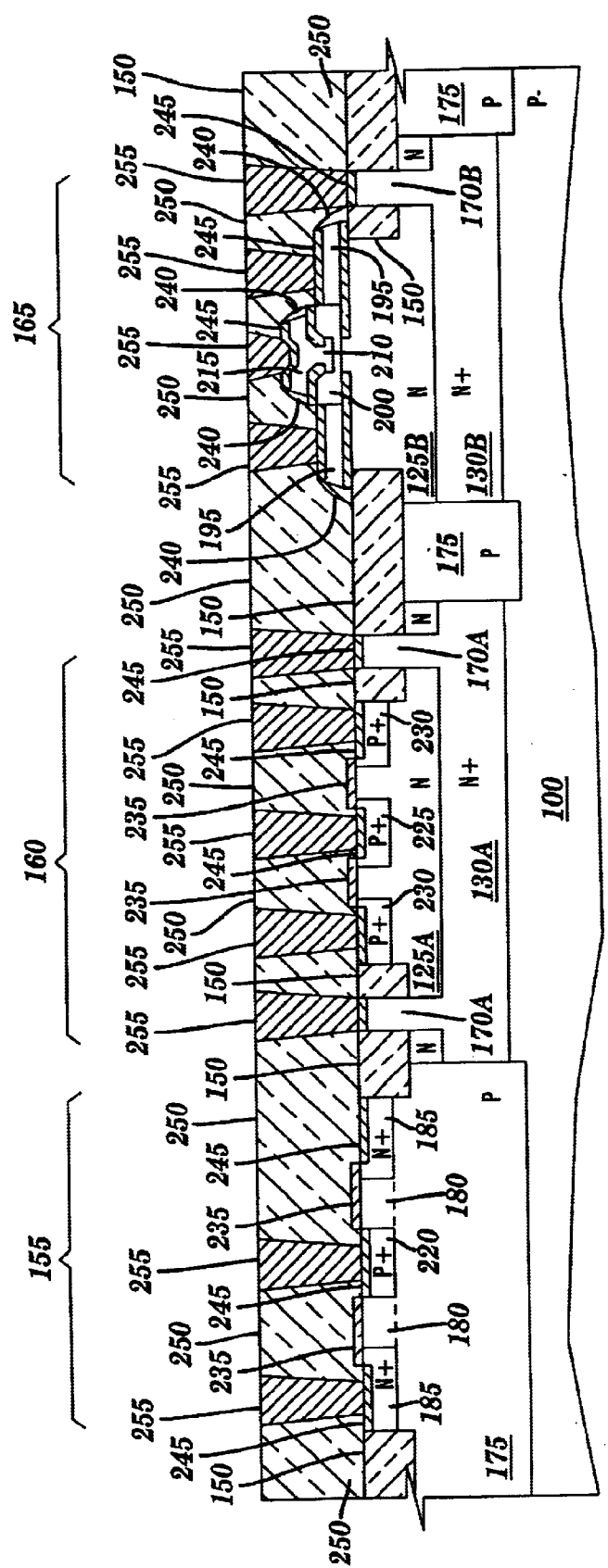

In FIG. 10, an interlevel dielectric layer 250 has been formed on substrate 100 and vias 255 formed in the interlevel dielectric layer contacting silicide contacts 245. Vias 255 may be formed by etching holes in interlevel dielectric layer 250 down to silicide contacts 240, depositing a conductor material to fill the hole and performing a CMP process to remove excess conductive material from the surface of the interlevel dielectric layer. In one example, vias 255 comprise tungsten.

Figure 11:
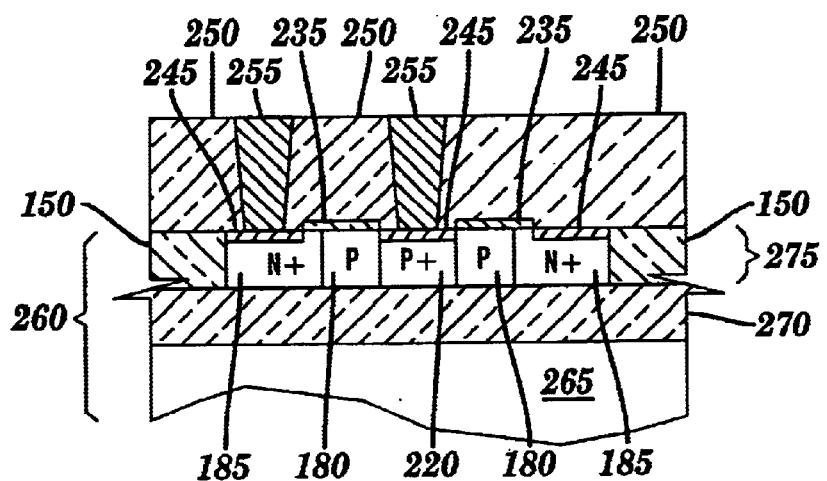
FIG. 11 is a cross-sectional side view illustrating the lateral diode according to a second embodiment of the present invention.

FIG. 11 is a cross-sectional side view illustrating the lateral diode according to a second embodiment of the present invention. In FIG. 11, the lateral diode of the present invention is fabricated in a silicon-on-insulator (SOI) substrate 260. SOI substrate comprises a silicon substrate 265 and a buried oxide layer (BOX) 270 formed between the silicon substrate and an upper, thin silicon layer 275. Formed in thin silicon layer 275 is trench isolation 150 reaching down to BOX layer 270. Formed between trench isolation 150 in thin silicon layer is a lateral diode comprising: P-region 180 and N+-region 185. P+ contact region 220 is formed in P region 180. Protective islands 235 are formed between and partially overlapping the P-region 180/N+-region 185. Silicide contacts 245 are formed in N+-region 185 P+ and P+ contact region 220. Vias 255 formed in interlevel dielectric layer 250 contact silicide contacts 245.

FIG. 11 illustrates a fully depleted diode, in that P-region 180,and N+-region 185 and P+ contact region 220 reach down to BOX 270. In the fully depleted case, thin silicon layer 275 would be less than 0.15 microns thick. In a partially depleted diode N+-region 185 and P+ contact region 220 would not reach down to BOX 270. In the partially depleted case, thin silicon layer 275 would be greater than 0.15 microns thick.

Fabrication of the lateral diode illustrated in FIG. 11 is similar to the process illustrated in FIGS. 1 through 10 and described above with the exceptions that no epitaxial layer is required and what was the isolation I/I is modified to a one-step tailoring implant if performed at all. The tailor I/I is about $1E^{12}$ to $1E^{14}$ atm/cm$^2$ of boron implanted at about 25 to 75 Kev.

Figure 12:
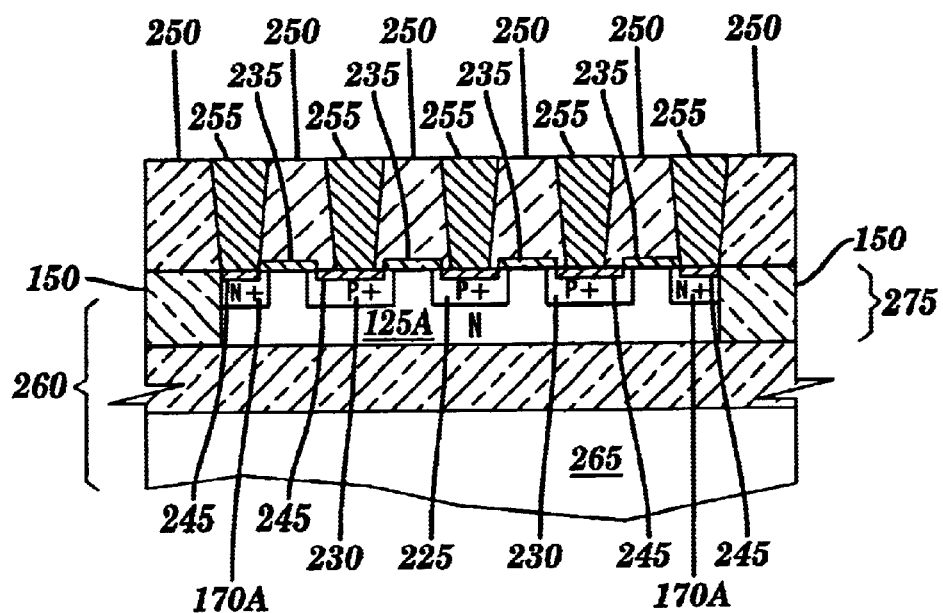
FIG. 12 is a cross-sectional side view illustrating the lateral bipolar transistor according to a second embodiment of the present invention.
Figure 13:
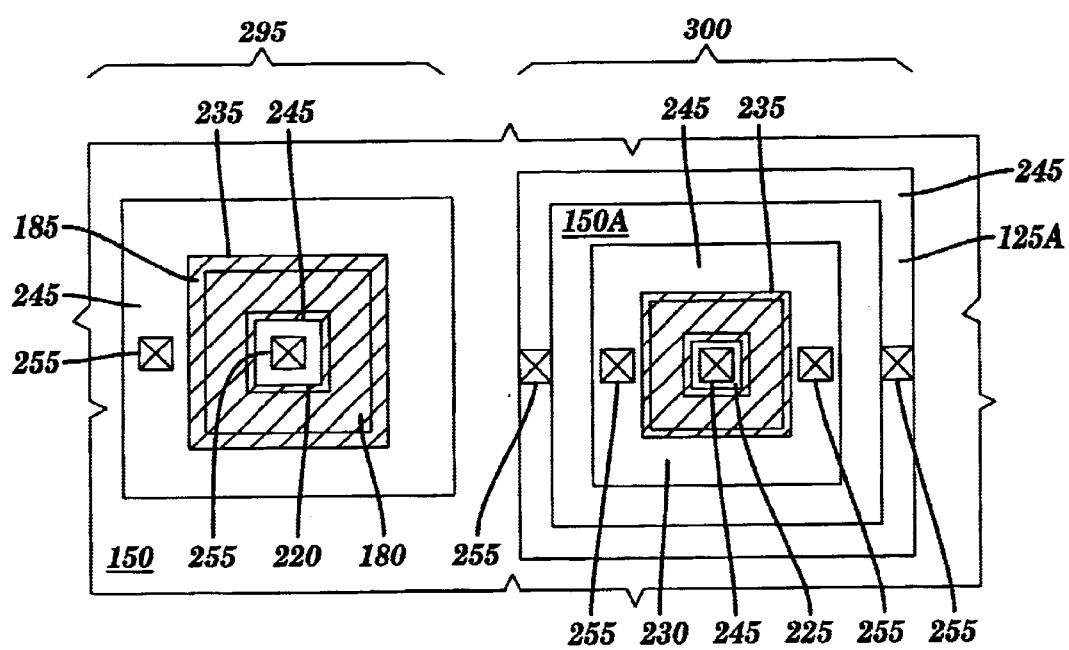
FIG. 13 is a top view illustrating the lateral diode and lateral bipolar transistor according to the present invention.

FIG. 12 is a cross-sectional side view illustrating the lateral bipolar transistor according to a second embodiment of the present invention. In FIG. 13, the lateral bipolar transistor of the present invention is fabricated in SOI substrate 260. SOI substrate comprises silicon substrate 265 and BOX layer 270 formed between the silicon substrate and upper, thin silicon layer 275. Formed in thin silicon layer 275 is trench isolation 150 reaching down to BOX layer 270. Formed between trench isolation 150 in thin silicon layer is a lateral bipolar transistor comprising: emitter 225, intrinsic base 125A, collector 230 and base contacts 170A. Diffused base contact 170A are formed between trench isolation 150 and collector 230. Protective islands 235 are formed between and partially overlap emitter 225 and collector 230. Protective islands 235 are formed between and partially overlap collector 230 and diffused base contact 170A. Silicide contacts 245 are formed in emitter 225, collector 230 and diffused isolation/base contacts 170A. Vias 255 formed in interlevel dielectric layer 250 contact silicide contacts 245.

FIG. 12 illustrates a partially depleted bipolar transistor, in that emitter 225, collector 230 and diffused base contacts 170A do not reach down to BOX 270. In the partially depleted case, thin silicon layer 275 is greater than 0.15 microns thick.

Fabrication of lateral bipolar transistor illustrated in FIG. 12 is similar to the process illustrated in FIGS. 1 through 10 and described above with the exceptions that no epitaxial layer is required and the isolation I/I is not needed and thus not performed.

FIG. 13 is a top view illustrating the lateral diode and lateral bipolar transistor according to the present invention. In FIG. 13, a lateral diode 295 is surrounded by trench isolation 150. Within trench isolation 150 is P-region 180 and N+-region 185. P+ contact region 220 is within P-region 180. Protective island 235 (cross-hatched) extends the length of the P-region 180 and N+-region 185 PN junction and partially overlaps the P-region and the N+-region. Silicide contacts 245 in N+-region 185 P+ and P+ contact region 220 are contacted by vias 255.

Also, in FIG. 13, a lateral bipolar transistor 300 according to the first embodiment is surrounded by trench isolation 150. Within trench isolation 150 is a shallow trench isolation ring 150A. Within ring 150A is emitter 225, intrinsic base 125A and collector 230. Protective island 235 (cross-hatched) extends the entire length of the emitter 225/ intrinsic base 125A PN junction and partially overlaps the emitter and the base. Protective island 235 also extends the entire length of the collector 230/intrinsic base 125A boundary and partially overlaps the collector and the base. Silicide contacts 245 in emitter 225, collector 230 and diffused base contacts 170A are contacted by vias 255.

In the second embodiment, ring 150A is not present and a second protective island in the form of a ring is formed between collector 230 and diffused base contacts 170A.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, fabrication of the lateral bipolar transistor has been illustrated and described using a PNP bipolar transistor. A NPN bipolar transistor may be similarly fabricated. Additionally, the lateral diode and lateral bipolar transistor may be fabricated in combination with complementary metal-oxide-silicon (CMOS) transistors. Further, while a ring type diode and a ring type bipolar transistor have been illustrated in FIG. 13 and described above, linear diodes and linear lateral bipolar transistors may be fabricated as well.

It is also apparent that process steps may be consolidated. For example, protective layer 110 may also be used to formed sidewall spacers on CMOS transistors. Additionally, the protective islands may be used to form other types of devices, such as resistors, by not forming P+ contact region 220 and adjusting the doping level of P-region 180. Therefore, it is intended that the following claims cover all such modifications and changes as fall within the true spirit and scope of the invention.

What is claimed is:

1. A method of fabricating a lateral semiconductor device, comprising:
   providing a substrate, having an upper silicon portion having a top surface;
   forming a first dopant type region and a second dopant type region in said upper silicon portion of said substrate, said first dopant type region abutting said second dopant type region and thereby forming a PN junction, said PN junction extending to said top surface; and
   forming a protective island in direct physical contact with said top surface of said upper silicon portion, said protective island extending over the entire length of said PN junction at said top surface and overlapping less than the entire surface area of said first dopant type region and less than the entire surface area of said second dopant type region.

2. The method of claim 1, further comprising forming a first silicide contact in at least portions of said first dopant type region and a second silicide contact in at least portions of said second dopant type region where said first dopant type region and said second dopant type region are not overlapped by said protective island.

3. The method of claim 1, wherein said protective island is selected from the group comprising silicon nitride or silicon nitride over silicon oxide, silicon oxide and silicon carbide.

4. The method of claim 2, wherein said silicide contact is cobalt silicide or titanium silicide.

5. The method of claim 1, wherein said substrate is a bulk silicon substrate or a silicon-on-insulator substrate.

6. A method of fabricating a lateral diode, comprising:
   providing a silicon substrate having a top surface;
   forming an N-region and a P-region in said substrate, said P-region abutting said N-region and thereby forming a PN junction said PN junction extending to said top surface; and
   forming a protective island in direct physical contact with a top surface of said substrate, said protective island extending over the entire length of said PN junction at said top surface and overlapping less than the entire surface area of said N-region and less than the entire surface area of said P-region.

7. The method of claim 6, further comprising forming silicide contacts in at least portions of said N-region and said P-region where said N-region and said P-region are not overlapped by said protective island.

8. The method of claim 6, wherein said protective island is selected from the group comprising silicon nitride or silicon nitride over silicon oxide, silicon oxide and silicon carbide.

9. The method of claim 7, wherein said silicide contact is cobalt silicide or titanium silicide.

10. The method of claim 6, wherein said lateral diode is formed in a first region of said substrate and further comprising forming a SiGe bipolar transistor in a second region of said substrate.

11. A method of fabricating a lateral bipolar transistor, comprising:
   providing a silicon substrate having a top surface;
   forming an emitter region, a base region and a collector region in said silicon substrate, said emitter region abutting said base region and thereby forming a first PN junction and said collector region abutting said base region and thereby forming a second PN junction, said first and second PN junctions extending to said top surface;
   forming a protective island in direct physical contact with said top surface of said silicon substrate, said protective island extending over the entire length of said first PN junction at said top surface and overlapping less than the entire surface area of said emitter region and less than the entire surface area of said base region; and
   said protective island extending over the entire length of said second PN junction at said top surface and overlapping less than the entire surface area of said collector region and less than the entire surface area of said base region.

12. The method of claim 11, further comprising forming silicide contacts in at least portions of said emitter region, said base region and said collector region where said emitter region, said base region and said collector region are not overlapped by said protective island.

13. The method of claim 11, wherein said protective island is selected from the group comprising silicon nitride or silicon nitride over silicon oxide, silicon oxide and silicon carbide.

14. The method of claim 12, wherein said silicide contact is cobalt silicide or titanium silicide.

15. The method of claim 11, wherein said lateral bipolar transistor is formed in a first region of said substrate and further comprising forming a SiGe bipolar transistor in a second region of said substrate.

16. A method of fabricating a lateral diode, comprising:
   providing a silicon on insulator substrate comprising a silicon layer over an insulator, said silicon layer having a top surface;
   forming an N-region and a P-region in said silicon layer, said P-region abutting said N-region and thereby forming a PN junction, said PN junction extending to said top surface; and
   forming a protective island in direct physical contact with said top surface of said silicon layer, said protective island extending over the entire length of said PN junction at said top surface of said silicon layer and overlapping less than the entire surface area of said N-region and less than the entire surface area of said P-region.

17. The method of claim 16, further comprising forming silicide contacts in at least portions of said N-region and said P-region where said N-region and said P-region are not overlapped by said protective island.

18. The method of claim 16, wherein said protective island is selected from the group comprising silicon nitride or silicon nitride over silicon oxide, silicon oxide and silicon carbide.

19. The method of claim 17, wherein said silicide contact is cobalt silicide or titanium silicide.

20. A method of fabricating a lateral bipolar transistor, comprising:

providing a silicon on insulator substrate comprising a silicon layer over an insulator, said silicon layer having a top surface;

forming an emitter region, a base region and a collector region in said silicon layer, said emitter region abutting said base region and thereby forming a first PN junction and said collector region abutting said base region and thereby forming a second PN junction, both said first and said second PN junctions extending to said top surface of said silicon layer;

forming a protective island in direct physical contact with said top surface of said silicon layer, said protective island extending over the entire length of said second PN junction at said top surface and overlapping less than the entire surface area of said emitter region and less than the entire surface area of said base region; and said protective island extending over the entire length of said second PN junction at said top surface and overlapping a less than the entire surface area of said collector region and less than the entire surface area of said base region.

21. The method of claim 20, further comprising forming silicide contacts in at least portions of said emitter region, said base region and said collector region where said emitter region, said base region and said collector region are not overlapped by said protective island.

22. The method of claim 20, wherein said protective island is selected from the group comprising silicon nitride or silicon nitride over silicon oxide, silicon oxide and silicon carbide.

23. The method of claim 21, wherein said silicide contact is cobalt silicide or titanium silicide.

24. A lateral semiconductor device, comprising:

a substrate, having an upper silicon portion, said upper silicon portion having a top surface;

at least one first dopant type region and at least one second dopant type region in said upper portion of said substrate, at least one of said first dopant type regions abutting at least one of said second dopant type regions and thereby forming at least one PN junction, said at least one PN junction extending to said top surface; and at least one protective island in direct physical contact with said top surface of said upper silicon portion, said protective island extending over the entire length of said at least one PN junction at said top surface and overlapping less than the entire surface area of said first dopant type region and less than the entire surface area of said second dopant type region.

25. The device of claim 24, further comprising a first silicide contact in at least portions of said first dopant type region and a second silicide contact in at least portions of said second dopant type region where said first dopant type region and said second dopant type region are not overlapped by said protective island.

26. The device of claim 24, wherein said protective island is silicon nitride or silicon nitride over silicon oxide.

27. The device of claim 25, wherein said silicide contact is cobalt silicide or titanium silicide.

28. The device of claim 24, wherein said substrate is a bulk silicon substrate or a silicon-on-insulator substrate.

29. A lateral diode, comprising:

a silicon substrate having a top surface;

an N-region and a P-region in said substrate, said P-region abutting said N-region and thereby forming a PN junction, said PN region extending to said top surface; and a protective island in direct physical contact with said top surface of said silicon substrate, said protective island extending over the entire length of said PN junction at said top surface and overlapping less than the entire surface area of said N-region and less than the entire surface area of said P-region.

30. The diode of claim 29, further comprising silicide contacts formed in at least portions of said N-region and said P-region where said N-region and said P-region are not overlapped by said protective island.

31. The diode of claim 29, wherein said protective island is selected from the group comprising silicon nitride or silicon nitride over silicon oxide, silicon oxide and silicon carbide.

32. The lateral diode of claim 30, wherein said silicide contact is cobalt silicide or titanium silicide.

33. A lateral bipolar transistor, comprising:

a silicon substrate having a top surface;

an emitter region, a base region and a collector region in said silicon substrate, said emitter region abutting said base region and thereby forming a first PN junction and said collector region abutting said base region and thereby forming a second PN junction, both said first and said seconf PN junctions extending to said top surface;

a protective island in direct physical contact with said top surface of said silicon substrate, said protective island extending over the entire length of said first PN junction and overlapping less than the entire surface area of said emitter region and less than the entire surface area of said base region; and said protective island extending over the entire length of said second PN junction and overlapping less than the entire surface area of said collector region and less than the entire surface area of said base region.

34. The transistor of claim 33, further comprising silicide contacts formed in at least portions of said emitter region, said base region and said collector region where said emitter region, said base region and said collector region are not overlapped by said protective island.

35. The transistor of claim 33, wherein said protective island is silicon nitride or silicon nitride over silicon oxide.

36. The transistor of claim 34, wherein said silicide contact is cobalt silicide or titanium silicide.

37. A lateral diode, comprising:

a silicon on insulator substrate comprising a silicon layer over an insulator, said silicon layer having a top surface;

an N-region and a P-region in said silicon layer, said P-region abutting said N-region and thereby forming a PN junction, said PN junction extending to said top surface of said silicon layer; and a protective island in direct physical contact with said top surface of said silicon layer, said protective island extending over the entire length of said PN junction at said top surface and overlapping less than the entire surface area of said N-region and a less than the entire surface area of said P-region.

38. The diode of claim 37, further comprising silicide contacts formed in at least portions of said N-region and said P-region where said N-region and said P-region are not overlapped by said protective island.

39. The diode of claim 37 wherein said protective island is selected from the group comprising silicon nitride or silicon nitride over silicon oxide, silicon oxide and silicon carbide.

40. The diode of claim 38, wherein said silicide contact is cobalt silicide or titanium silicide.

41. A lateral bipolar transistor, comprising:

a silicon on insulator substrate comprising a silicon layer over an insulator, said silicon layer having a top surface;

an emitter region, a base region and a collector region in said silicon layer, said emitter region abutting said base region and thereby forming a first PN junction and said collector region abutting said base region and thereby forming a second PN junction, said first and said second PN junctions extending to said top surface of said silicon layer;

a protective island in direct physical contact with said top surface of said silicon layer, said protective island extending over the entire length of said first PN junction at said top surface of said silicon layer and overlapping less than the entire surface area of said emitter region and less than the entire surface area of said base region; and said protective island extending over the entire length of said second PN junction at said top surface of said silicon layer and overlapping less than the entire surface area of said collector region and a less than the entire surface area of said base region.

42. The transistor of claim 41, further comprising silicide contacts formed in at least portions of said emitter region, said base region and said collector region where said emitter region, said base region and said collector region are not overlapped by said protective island.

43. The transistor of claim 41, wherein said protective island is selected from the group comprising silicon nitride or silicon nitride over silicon oxide, silicon oxide and silicon carbide.

44. The transistor of claim 42, wherein said silicide contact is cobalt silicide or titanium silicide.

* * * * *